United States Patent

Ristow et al.

Patent Number: 5,960,269
Date of Patent: Sep. 28, 1999

[54] METHOD FOR MANUFACTURING A FIELD EFFECT TRANSISTOR USING AN AUXILIARY LAYER DEPOSITED AT A VERY FLAT INCIDENT ANGLE

[75] Inventors: Dietrich Ristow, Neubiberg; Antonio Mesquida Kuesters, Munich, both of Germany

[73] Assignee: Siemens Aktiengesellschaft, Munich, Germany

[21] Appl. No.: 08/906,780

[22] Filed: Aug. 6, 1997

[30] Foreign Application Priority Data

Aug. 6, 1996 [DE] Germany ............... 196 31 744

[51] Int. Cl.⁶ ..................................... H01L 21/302
[52] U.S. Cl. ..................... 438/172; 438/167; 257/194
[58] Field of Search ................ 438/167, 172, 438/174, 180; 257/192, 194

[56] References Cited

U.S. PATENT DOCUMENTS

| | | |
|---|---|---|
| 4,377,899 | 3/1983 | Otani et al. . |
| 5,539,222 | 7/1996 | Le et al. . |
| 5,869,364 | 2/1999 | Nakano et al. . |

FOREIGN PATENT DOCUMENTS 6-232168  8/1994  Japan .

*Primary Examiner*—Charles Bowers
*Assistant Examiner*—Keith Christianson
*Attorney, Agent, or Firm*—Hill & Simpson

[57] ABSTRACT

In a method for manufacturing a field effect transistor, a semiconductor layer sequence is grown that has a channel layer (2), a barrier layer (3) and a highly doped InGaAs layer (6) suitable for low-impedance contacting to a metal contact. A passivation layer (8) of dielectric is applied and is structured for the region lying between source, gate and drain. An auxiliary layer (10) is applied by vapor-deposition in a very flat incident angle such that the gate region remains free. The semiconductor layers are etched out in the region of the gate down onto the barrier in a plurality of RIE etching processes. The auxiliary layer is removed, spacers are produced at the sidewalls of the passivation layer, a refractory metallization is deposited surface-wide and etched back in planarizing fashion, so that separate contacts for source, gate and drain derive. Finally, the terminal metallization is applied. An alternative embodiment provides that a layer sequence composed of a thin dielectric layer and of at least polyimide or metal layer be provided for the passivation layer (8). After the application of the terminal metallization, the polyimide or metal parts of the passivation layer are removed, so that only a thin passivation layer remains between the terminal contacts for minimizing parasitic capacitances.

19 Claims, 4 Drawing Sheets

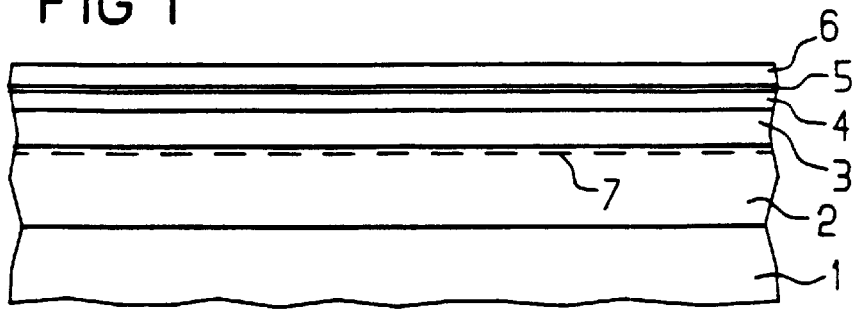
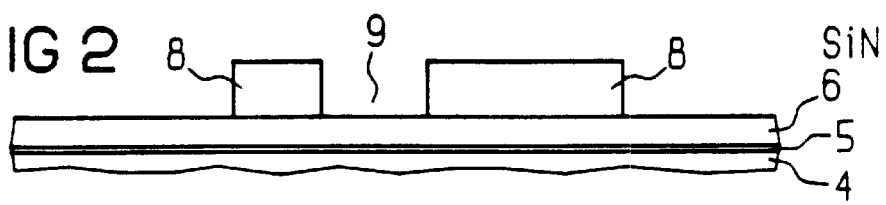
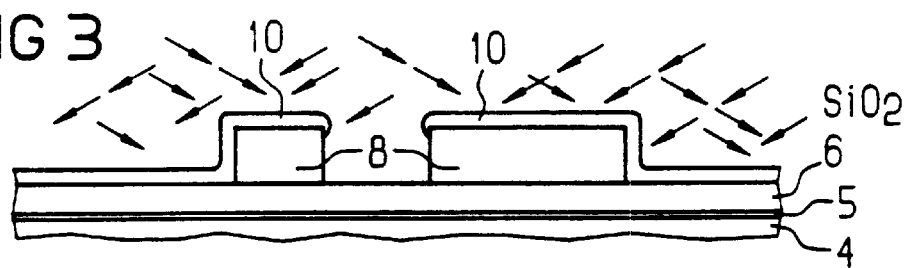
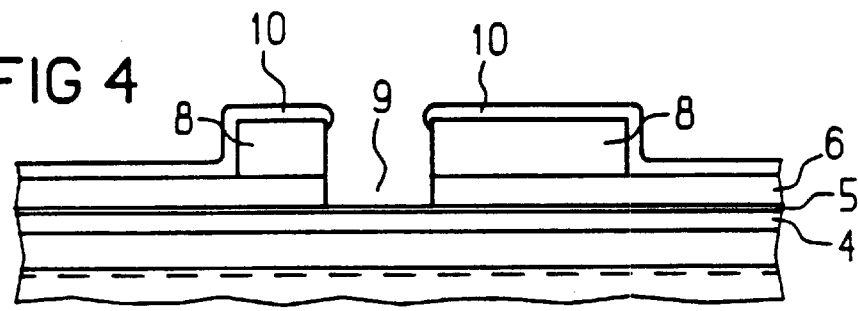

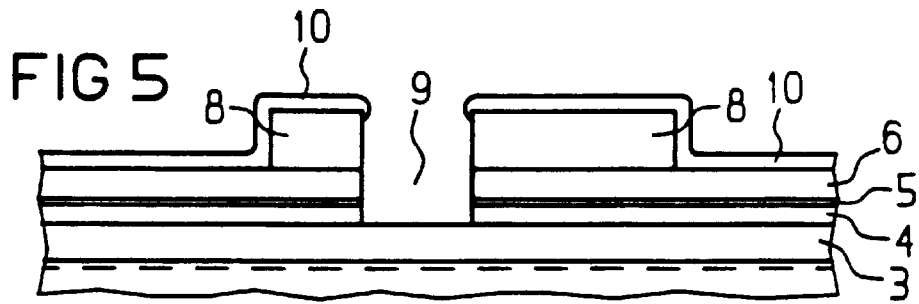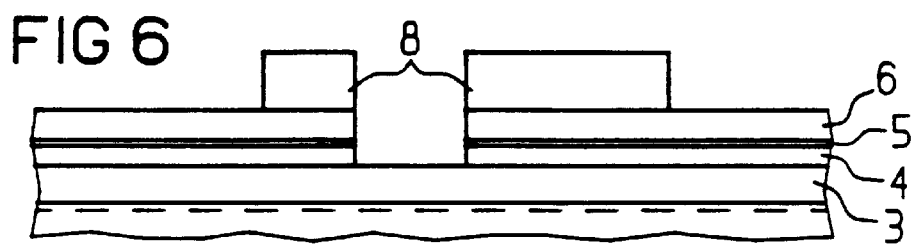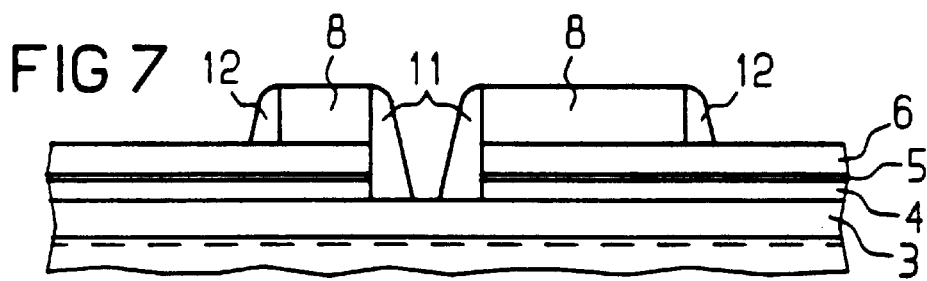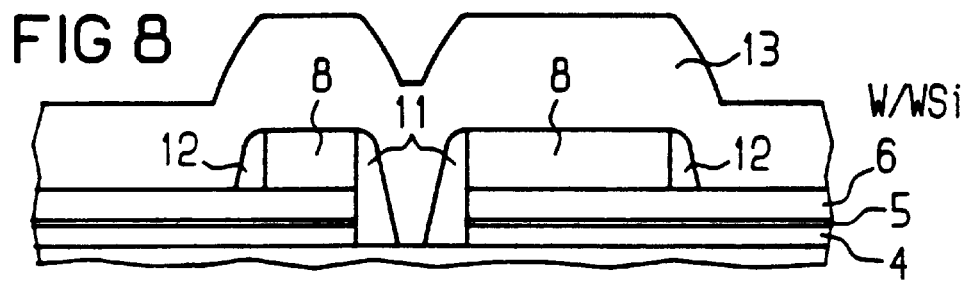

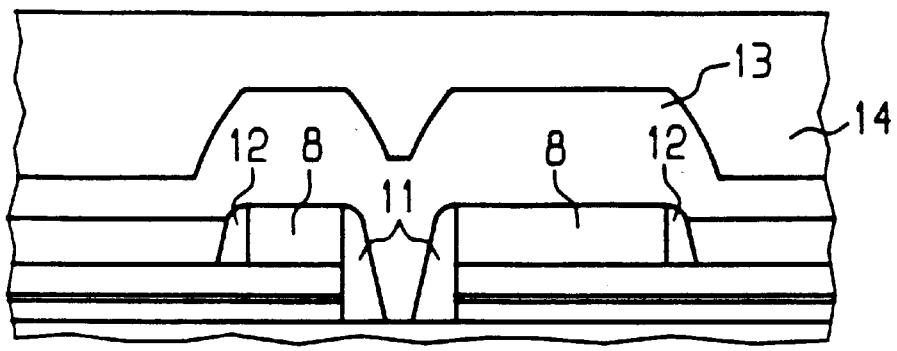
FIG 9  z.B. Accuflo-Lack
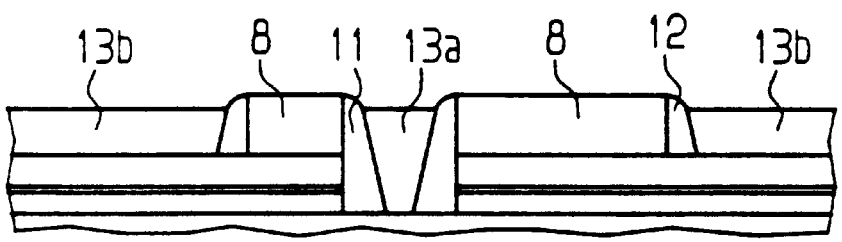
FIG 10
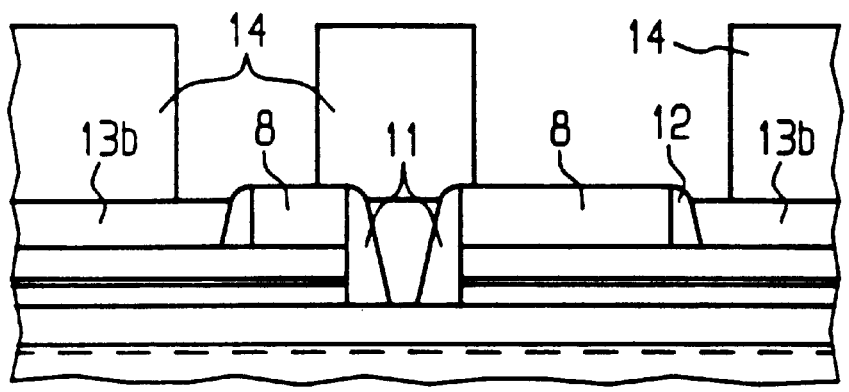
FIG 11  z.B. Ti/Pt/Au

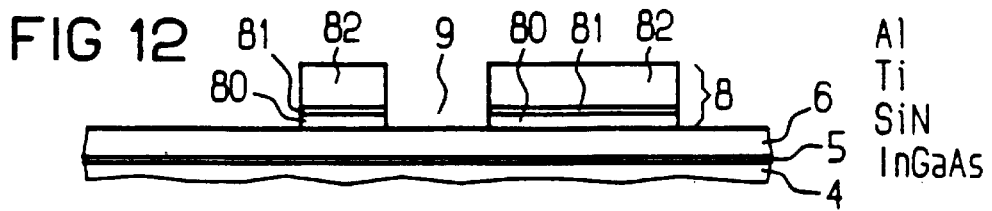
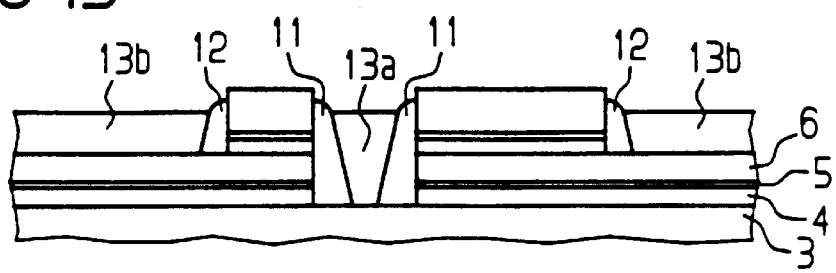
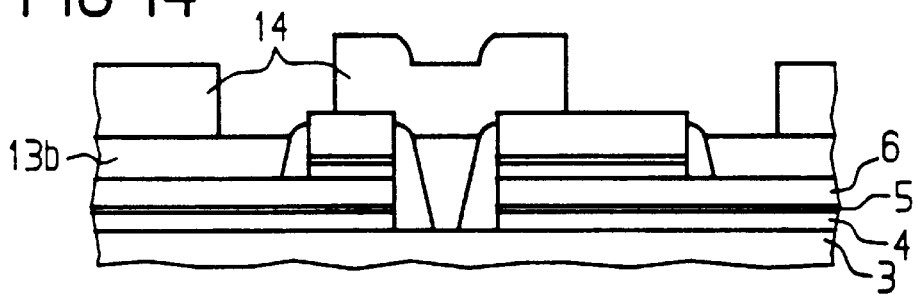
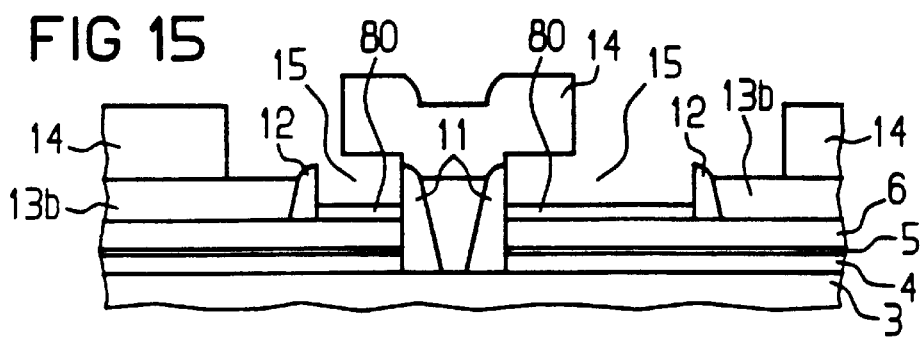

METHOD FOR MANUFACTURING A FIELD EFFECT TRANSISTOR USING AN AUXILIARY LAYER DEPOSITED AT A VERY FLAT INCIDENT ANGLE

BACKGROUND OF THE INVENTION

The present invention is directed to the manufacture of a field effect transistor wherein a common metallization is applied for the ohmic contacts of source and drain and the Schottky contact of the gate.

In field effect transistors (for example, MESFET, HEMT), the gate is localized as close as possible to the source. The source metallization forms an ohmic contact (a conductive transition between metal and semiconductor) on the semiconductor material. The metallization for the gate forms a Schottky contact (i.e. a junction between the metal electrode and the semiconductor material that inhibits in one current direction). The gate metal is therefore generally to be separately applied from the ohmic metal employed for the source and drain. As a result of the alignment of the two types of metal for the three electrodes relative to one another, a scatter in the positioning and, thus, a scatter of the electrical parameters of the transistor arises as a result of the alignment precision of the lithography technique.

Given alloyed ohmic contacts, two photolithographic steps are employed for a germanium implantation and a common metallization in what is referred to as DIOM technique (DIOM=double implantation one metallization). This is disclosed, for example, by European reference EP 0 034 729 B1. A version of this DIOM technique manages with one photolithography step having two depositions of layers in situ. In this method disclosed by German reference DE 42 19 935, germanium for the contacts of source and drain is first vapor-deposited obliquely onto a mask with openings in the regions of source, gate and drain such that the metallization for source and drain is produced but the region of the gate remains free. Subsequently, the metallization provided for the gate is applied in an anisotropic, perpendicular vapor-deposition. Disadvantages of this method are that the lower parts of the sidewalls of the mask employed are not reached in the vapor-deposition and the lateral angles between these sidewalls and the semiconductor surface are therefore not covered, that the utilization thereof at high temperatures encounters its method-conditioned limit due to the employment of the subsequent alloying process, and that the sintered gate contact has a natural residual roughness of the alloy front, this limiting the management of the cut-off voltage of the FET.

It is also known to manufacture FETs with unalloyed ohmic contacts on highly doped InGaAs layers (doping density greater than $10^{19}$ $cm^{-3}$). Such layers, namely, form such a thin and low barrier that enough electrons can flow from each metal contact into this InGaAs layer. Since InGaAs is epitaxially deposited and covers the substrate surface-wide, the InGaAs layer must be selectively removed (etched off) in the gate region so that the gate metal can, for example, form a Schottky contact with the GaAs and can control the current in more deeply disposed layers (channel layer). In conventional methods of the species for HEMTs (high electron mobility transistor) with InGaAs contact layer (as cover layer at the upper side of the component), two photolithography steps for two different metal depositions are likewise required. Publications are, for example for an arrangement on GaAs substrate, the article by M. Nihei et al, "Nonalloyed Ohmic Contacts for HEMTs Using n⁺-InGaAs Layers Grown by MOVPE", in IEICE Trans. Electron. E77-C, 1431–1436 (1994), and, on InP-substrate, the article by N. Yoshida et al. "Low Noise AlInAs/InGaAs HEMT using WSi ohmic contact" in Electronics Letters 30, 1009–1010 (1994). Alternatively thereto, two photolithography steps can be employed for a selective etching and for a common aluminum deposition, as disclosed, for example, in the article by S. Kuroda et al, "A New Fabrication Technology for AlGaAs/GaAs HEMT LSI's Using InGaAs Nonalloyed Ohmic Contacts", in IEEE Transact. Electr. Dev. 36, 2196–2203 (1989).

Japanese reference JP 1-265571 discloses a method for manufacturing a Field Effect Transistor (FET) wherein a highly doped contact layer is applied on a channel layer, this contact layer is removed in the region of the gate, spacers on the channel layer and adjoining the remaining parts of the contact layer are produced upon employment of an auxiliary layer, and, after the removal of the remaining auxiliary layer and the lateral application of photoresist, a metallization is applied that decomposes in metallizations that are provided for source, gate and drain and that are electrically insulated from one another by the spacers. In this method, only one Al layer need be applied by vapor-deposition. Given employment of only one photolithography step, the gate-drain spacing is limited by the possibilities in the manufacture of the spacers, i.e. the breakdown voltage that can be achieved is correspondingly low. Given employment of two lithography steps for structuring the dielectric auxiliary layer (double spacer), the scatter of the parameters of the transistor becomes greater as a consequence of the required adjustment for the photolithography. German reference DE 39 13 540 A1 discloses a method for the manufacture of field effect transistors wherein a structuring layer is obliquely vapor-deposited onto a mask, so that an opening with small dimensions provided for the structuring of a gate electrode is formed in the mask opening. Germanium is preferably employed as material for the structuring layer. A dielectric material is likewise recited as being suitable.

SUMMARY OF THE INVENTION

It is an object of the present invention to specify a method for manufacturing a field effect transistor that eliminates the described difficulties and is simplified by comparison to known methods.

In general terms the present invention is a method for manufacturing a field effect transistor. At least a channel layer, a barrier layer of semiconductor material and an ohmic contact layer of a semiconductor material suitable for low ohmic impedance with a metal are grown onto a substrate of semiconductor materials. A passivation layer with an opening in the region of a gate to be manufactured is applied. A deposition of an auxiliary layer anisotropically ensues and with an oblique incident direction with respect to the semiconductor layer such that the upper side of the semiconductor material of the ohmic contact layer is left free of the material of this auxiliary layer in the region of this opening in the passivation layer. The semiconductor material is etched out down to the barrier layer using this auxiliary layer as a mask. The auxiliary layer is removed. Spacers at the lateral sidewalls of the passivation layer are produced by surfacewide, isotropic deposition and subsequent anisotropic re-etching of a further auxiliary layer. A refractory metallization is deposited surface-wide. This metallization is etched back to such an extent in planarizing fashion that separate contacts from source, gate and drain remain. These contacts are provided with a terminal metallization.

Advantageous developments of the present invention are as follows.

The passivation layer is applied as a layer of sequence composed of a dielectric layer and of at least one metal layer. The metal layer or metal layers of the passivation layer are removed after the application of the terminal metallization.

The passivation layer is manufactured as a layer sequence of silicon nitride, titanium and aluminum.

The passivation layer is applied as a layer of sequence composed of a dielectric layer and of a polyimide layer. The polyimide layer is removed after the application of the terminal metallization.

The barrier layer is grown of AlGaAs and the ohmic contact layer is grown of InGaAs.

At lease one further layer of a semiconductor material that can be etched selectively relative to the barrier layer is grown between the barrier layer and the ohmic contact layer.

An intermediate layer of GaAs, a layer provided as an etch stop layer that is composed of a semiconductor material etchable selectively relative to InGaAs and a layer of InGaAs provided as ohmic contact layer are grown successively onto a layer of InGaAs.

The passivation layer is applied of $Si_3N_4$. The auxiliary layer is applied of $SiO_2$. The ohmic contact layer is removed down to the etch stop layer. The etch stop layer is removed. The intermediate layer is nearly completely removed with RIE (reactive ion etching) in an $Ar:SiCl_4$ plasma.

$SF_6$ is added to the gases of the plasma in the step of etching the stop layer.

The RIE process is continued in an $Ar:SiCl_4:SF_6$ plasma, whereby the temperature and the remaining parameters of the process are set such a further etch stop layer of aluminum fluoride is formed at the upper side of the barrier layer when the barrier layer is reached.

$SiCl_4$ is withdrawn from the gases of the plasma. The step of removing the auxiliary layer is implemented in that the RIE process is continued in an $Ar:SF_6$ plasma.

In the inventive method, a channel layer for the gate region and an ohmic contact layer that is suitable for low ohmic impedance in the transition to a metal contact and that is composed of semiconductor material are grown on a substrate. A dielectric passivation layer is applied and removed in the regions that are provided for source, gate and drain. An auxiliary layer is anisotropically deposited at a flat incident angle onto this passivation layer, this auxiliary layer leaving the upper side of the ohmic contact layer in the opening of the passivation layer free for the gate region. This important method step makes it possible to subsequently remove the ohmic contact layer in the region of the gate. Preferably, an intermediate layer is employed between the ohmic layer and the channel layer in order to be able to optimally set the recess of the transistor for the intended cutoff voltage. After the semiconductor material has been etched out in the region of the gate down to the channel layer, the auxiliary layer can be removed. As a result of surface-wide, isotropic deposition of a dielectric layer and subsequent anisotropic re-etching, spacers (sidewall spacers) are produced at the sidewalls of the passivation layer. A metallization is applied surface-wide and re-etched in planarizing fashion. Separate metallizations thus derive for source, gate and drain. This metallization is preferably applied with a refractory metal such as, for example, tungsten or tungsten silicide. At the end, the actual terminal metallization is applied for the external connection of the gate region.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIGS. 1–11 show intermediate products of a transistor manufacture according to the inventive method after various method steps; and FIGS. 12–15 show the illustrations of FIGS. 2, 10 and 11 for an alternative embodiment.

DESCRIPTION OF THE PREFERRED EMBODIMENTS

In the method and as shown in FIG. 1, a channel layer 2, a barrier layer 3, an intermediate layer 4, an etching stop layer 5 and an ohmic contact layer 6 are grown onto a substrate 1 that is potentially provided with one or more buffer layers. The buffer layers can be omitted given adequately high quality of the substrate. Below and in the claims, what is to be understood by the substrate is potentially the layer sequence composed of the actual substrate 1 and one or more buffer layers. The further layers are doped in the traditional way according to the transistor that is provided. In particular, the upper ohmic contact layer 6 is so highly doped that the semiconductor material forms a good low-impedance contact to a metallization to be applied. The doping is also selected such that a two-dimensional electron gas forms in the transistor in the channel layer 2, this being indicated in FIG. 1 by the broken line 7. Preferably, into consideration as materials for the layers are: InGaAs for the channel layer 2, AlGaAs for the barrier layer 3, GaAs for the intermediate layer 4, for example GaInP or AlAs for the etch stop layer 5 and InGaAs for the ohmic contact layer 6.

A dielectric passivation layer is deposited onto this layer sequence and preferably photolithographically structured such that it defines the spacings provided for source, gate and drain. The structure passivation layer 8 with the opening 9 in the region of the gate to be manufactured is shown in cross-section in FIG. 2. The passivation layer is manufactured with such a thickness that the effect of shadowing desired in the following method step and the desired gate length are achieved. For manufacturing this passivation layer, approximately, for example, 500 nm thick silicon nitride ($Si_3N_4$) is deposited, for example with plasma CVD (Chemical Vapor Deposition) and is structured, for example with RIE (Reactive Ion Etching), in a $Ar:SF_6$ plasma.

An auxiliary layer 10 is then deposited, as shown in FIG. 3. Two vapor depositions with the material of the auxiliary layer are simultaneously undertaken in mutually opposite directions at a flat incident angle, i.e. at a large angle relative to the perpendicular onto the semiconductor layer planes. These vapor-deposition directions lie in the plane that resides perpendicularly on the plane of the semiconductor layers and in which the shortest connection between source and drain lies (plane of the drawing of FIG. 3); these are indicated with arrows in FIG. 3. The auxiliary layer, for example, is applied from silicon dioxide, for example approximately 30 nm thick. In any case, the auxiliary layer is applied at most to such a thickness that the regions provided for source and drain are covered but the region provided for the gate in the inside of the opening of the passivation layer 8 remains free. The auxiliary layer can be composed of one or more layers of different materials and is of such a nature that the regions of source and drain are masked during the following steps and thus remain protected.

Subsequently, the ohmic contact layer (example) is etched InGaAs in this example) is etched off in the region of the gate (opening 9) to be produced. This etching step, for example, can be wet-chemically implemented when an etch stop layer 5 of GaInP is employed. For example, this etch stop layer 5 should then have been grown on, for example, approximately 5 nm thick. InGaAs can be wet-chemically removed with $H_3PO_4:H_2O_2$. When an etch stop layer of AlAs is employed, this is preferably likewise approximately 5 nm thick. The InGaAs of the ohmic contact layer is then removed by dry etching in a RIE step with $Ar:CH_4:H_2$. The structure that is shown in cross-section in FIG. 4 derives.

The etch stop layer 5 is then removed. An etch stop layer of GaInP or of AlAs, for example, is removed wet-chemically with HCl or by dry etching in a RIE step with $Ar:SiCl_4$ or with $Ar: BCl_3$.

This is followed by the etching of the recess for setting the cutoff voltage of the transistor (for example HEMT). This etching ensues into the intermediate layer 4 down onto the barrier layer 3 and comprises a plurality of sub-steps in this example. First, the intermediate layer 4 that, for example is preferably GaAs is nearly complete removed with RIE upon employment of $Ar:SiCl_4$ plasma. Shortly before the barrier layer of AlGaAs located therebelow is reached, the radio-frequency power for the excitation of the plasma is deactivated. The point in time for stopping the etching process is calculated for the etching time with a given etching rate taking the process tolerances up to this point in time of the etching process that can be achieved into consideration. $SF_6$ is then added to the gas. After equilibrium has occurred in the gas mixture, the radio-frequency power is activated and further etching is carried out in the $AR:SiCl_4:SF_6$ plasma. When the etching process reaches the AlGaAs of the barrier layer 3, a thin layer (approximately 2 nm) of aluminum fluoride ($AlF_3$) that acts as etch stop layer, i.e. that significantly reduces the etching rate, is formed dependent on the temperature that is set and dependent on the other process parameters. The excitation of the plasma is then deactivated. The etching duration with the additive of $SF_6$ is kept short because the auxiliary layer 10 of the $SiO_2$ is simultaneously etched in this etching step. It is allowed to be incipiently etched but dare not be completely etched through, so that the ohmic contact layer remains uninjured in the regions for source and drain. The gas intake of $SiCl_4$ is disconnected. After the equilibrium has again been reached in the remaining gases, etching is continued to be carried with isotropic etching in a further RIE step in an $Ar:SF_6$ plasma and the $SiO_2$ auxiliary layer 10 is completely removed in this way. The selectivity when etching $SiO_2$ relative to $Si_3N_4$ is so good that only an insignificant amount of $Si_3N_4$ is thereby eroded. The structures shown in FIGS. 5 and 6 are successively obtained in this way.

Spacers are then produced at the sidewalls of the passivation layer 8. This preferably occurs in that a layer is deposited surface-wide and subsequently etched back anisotropically. For example, a layer of $Si_3N_4$ can be deposited with plasma CVD and can be subsequently etched back anisotropically with $Ar:SF_6$ in a RIE step. As a result thereof, the inner spacers 11 and outer spacers 12 are produced at the sidewalls of the passivation layer 8 (see FIG. 7). The end faces of the ohmic contact layer InGaAs that face toward the gate region are insulated by these spacers 11 from the gate metal to be subsequently applied and the gate length of the transistor is defined by the spacers 11. When, for example in the method step with which the passivation layer was structured, a photolithographically defined opening 9 of this passivation layer was determined in the region of the gate to be manufactured 500 nm in the direction of source toward drain and when the spaces 11 at the low end have an expanse of 150 nm, then a gate length of 200 nm derives.

In the described exemplary embodiment, thin indium fluoride layers on the upper side of the ohmic contact layer derive in the regions of source and drain and a thin aluminum fluoride layer derives on the upper side of the channel layer in the region of the gate to be manufactured as a consequence of this process management. The fluoride layers, for example, can be wet-chemically removed with ammonia. Process steps follow for applying the metal contacts. According to FIG. 8, a metallization of refractory metal such as, for example, tungsten or a layer sequence of tungsten and tungsten suicide (WSi) that minimizes the stress (internal tensile stress) is deposited surface-wide. When a sputtering process is utilized for this method step, the angles at the lower sidewalls of the layers can be better than given vapor-deposition of the metal. The metallization 13 is subsequently etched back in planarizing fashion. To that end, it is expedient to apply a planarizing layer 14 (see FIG. 9), for example of a resist, particularly of a thermally flowable resist (for example accufloresist protected trademark of Allied Signals), in order to create a completely planar surface. The re-etching of the metallization again preferably ensues with RIE in a $Ar:SF_6:O_2$ plasma until the metallization 13 is removed to such an extent that a part 13a (see FIG. 10) in the region of the gate and parts 13b separated therefrom in the regions of source and drain remain. When the materials are selected as recited as the example (W for the metallization 13, $Si_3N_4$ for the passivation layer 8 and for the spaces 11, 12), the structure indicated in FIG. 10 wherein the surfaces of the portions 13a, 13b of W lie somewhat deeper than the surface of the $Si_3N_4$ (8, 11, 12) that is indicated in FIG. 10 derives because of the higher etching rate of W relative to $Si_3N_4$. This characteristic proves advantageous in the method. A terminal metallization, for example a layer sequence of titanium, platinum and gold, can then be applied and structured as terminal metallization, as shown in FIG. 11.

For reducing the parasitic capacitances between source and gate and between gate and drain, the dielectric of the passivation layer 8 can also be selected thinner, i.e. so thin as minimally required for the necessary passivation. To that end, the method can be varied in the following way: As passivation layer 8, a layer sequence composed of a thin dielectric layer 80 and of one or more metal layers 81, 82 is applied and are structured according to FIG. 12. The dielectric layer 80 can also, for example, be $Si_3N_4$ here. However, it is applied only to a thickness of, for example, approximately 50 nm. A metal layer is deposited thereon, this being composed of a thin titanium layer (thickness of about 10 nm) in this exemplary embodiment that serves as adhesion promoter and that is further composed of an aluminum layer (thickness of about 440 nm) applied thereon. The structuring of these metal layers ensues, for example, with lift-off technique. The structured metal layer can then be employed as a mask for the etching of the dielectric layer 80. For example, a dielectric layer 80 of $Si_3N_4$ is etched off with $Ar:SF_6$ in a RIE step. In this way, the structure shown in cross-section in FIG. 12 is obtained. The ohmic contact layer 6 here can also preferably be InGaAs that was doped adequately highly. Polyimide resist having an integrated adhesion promoter can be employed instead of the metal layers 81, 82. The polyimide applied onto the dielectric layer 80 is baked at 350° C. Polyimide with additive of adhesion promoter is offered as a complete mixture by manufacturers of the resist. As a result of the baking, solvents that are present are driven from the resist, so that the polyimide is subsequently suitable for further process steps.

As a result of the RIE process that is utilized, it is particularly the inner end face (sidewall) of the metal layers 81, 82 that are coated with a thin fluoride layer. The aluminum layer 82 cited as an example is thus covered at its surface with a thin aluminum fluoride layer. This fluoride layer protects the metal against the attack of chlorine ions in the following method step wherein the intermediate layer 4 of GaAs is removed with RIE in an Ar:SiCl$_4$ plasma.

The method steps shown for the first exemplary embodiment in FIGS. 3–9 can be correspondingly implemented in the second exemplary embodiment upon employment of the modified passivation layer 8. When re-etching the metallization layer 13 with RIE in an Ar:SF$_6$O$_2$ plasma, the aluminum of the metal layer 82 is not etched, the Si$_3$N$_4$ of the dielectric layer 80 is only slighted etched and the tungsten of the metallization 13 is etched with a normal etching rate. As a result of this etching process, the structure shown in cross-section in FIG. 13 is therefore obtained, wherein it can be seen that the metallization again divides into a first part 13a for the gate and a part 13b separated therefrom for source and drain. The terminal metallization 14 can then again be applied and structured (see FIG. 14), to which end a layer sequence of titanium, platinum and gold as contact reinforcement can also be applied here. The metal of the metal layers 81, 82 (aluminum and titanium in this example) provided for the passivation layer 8 or, respectively, the polyimide structure can then be removed. In the case of aluminum and titanium, for example, this occurs with H$_3$PO$_4$ at room temperature, in the case of polyimide, for example ensues with isotropic RIE (reactive ion etching) in an oxygen plasma. No hot H$_3$PO$_4$ is employed because the Si$_3$N$_4$ of the dielectric layer 80 would thus be etched. Of the passivation layer 8, only the actual, lower parts of the dielectric layer 80 on the ohmic contact layer between the spaces 11, 12 that are provided for the passivation remain. Due to the smaller portion of dielectric between the part of the terminal metallization 14 over the gate and the metallizations 13b for source and drain, the effective dielectric constant and, thus, the parasitic capacitance are reduced.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for manufacturing a field effect transistor, comprising the steps of:
   a) growing at least a channel layer, a barrier layer of semiconductor material and an ohmic contact layer of a semiconductor material, which has low ohmic impedance with metal, onto a substrate of semiconductor materials;
   b) applying a passivation layer over the ohmic contact layer with an opening in a region of a gate to be manufactured;
   c) anisotropically depositing an auxiliary layer with an oblique incident direction with respect to the semiconductor layer such that an upper side of semiconductor material of the ohmic contact layer is left free of material of auxiliary layer in a region of the opening in the passivation layer;
   d) etching out semiconductor material down to the barrier layer using the auxiliary layer as a mask;
   e) removing the auxiliary layer;
   f) producing spacers at lateral sidewalls of the passivation layer by surface-wide, isotropic deposition and subsequent anisotropic re-etching of a further auxiliary layer;
   g) depositing surface-wide a refractory metallization;
   h) etching back the metallization to an extent in planarizing fashion such that separate contacts for source, gate and drain remain; and
   i) providing the contacts with a terminal metallization.

2. The method according to claim 1, wherein, in step b), the passivation layer is applied as a sequence of layers composed of a dielectric layer and of at least one metal layer; and wherein, in step i), at least one metal layer of the passivation layer is removed after application of the terminal metallization.

3. The method according to claim 2, wherein the passivation layer is manufactured as a sequence of layers composed of silicon nitride, titanium and aluminum.

4. The method according to claim 1, wherein, in step b), the passivation layer is applied as sequence of layers composed of a dielectric layer and of a polyimide layer; and wherein, in step i), the polyimide layer is removed after application of the terminal metallization.

5. The method according to claim 1, wherein, in step a), the barrier layer is grown of AlGaAs and the ohmic contact layer is grown of InGaAs.

6. The method according to claim 1, wherein, in step a), at least one further layer of a semiconductor material, which is selectively etchable relative to the barrier layer, is grown between the barrier layer and the ohmic contact layer.

7. The method according to claim 6, wherein, in step a), an intermediate layer of GaAs, a layer provided as an etch stop layer and composed of a semiconductor material selectively etchable relative to InGaAs, and a second layer of InGaAs, which is provided as an ohmic contact layer, are grown successively onto a first layer of InGaAs.

8. The method according to claim 7, wherein in step b), the passivation layer is Si$_3$N$_4$; wherein, in step c), the auxiliary layer is SiO$_2$; and wherein, in step d),
   i) the ohmic contact layer is removed down to the etch stop layer,
   ii) the etch stop layer is removed,
   iii) the intermediate layer is substantially removed with reactive ion etching in an Ar:SiCl$_4$ plasma,
   iv) SF$_6$ is added to the gases of the plasma in step ii,
   v) the reactive ion etching process is continued in an Ar:SiCl$_4$:SF$_6$ plasma, whereby temperature and remaining parameters of the process are set such that a further etch stop layer of aluminum fluoride is formed at an upper side of the barrier layer when the barrier layer is reached,
   vi) SiCl$_4$ is withdrawn from gases of the plasma, and the step e) is implemented in that the reactive ion etching process is continued in an Ar:SF$_6$ plasma.

9. A method for manufacturing a field effect transistor, comprising the steps of:
   a) growing at least a channel layer, a barrier layer of semiconductor material and an ohmic contact layer of a semiconductor material, which has low ohmic impedance with metal, onto a substrate of semiconductor materials;
   b) applying a passivation layer over the ohmic contact layer with an opening in a region of a gate to be manufactured, the passivation layer being applied as a sequence of layers composed of silicon nitride, titanium and aluminum;

c) anisotropically depositing an auxiliary layer with an oblique incident direction with respect to the semiconductor layer such that an upper side of semiconductor material of the ohmic contact layer is left free of material of auxiliary layer in a region of the opening in the passivation layer;

d) etching out semiconductor material down to the barrier layer using the auxiliary layer as a mask;

e) removing the auxiliary layer;

f) producing spacers at lateral sidewalls of the passivation layer by surface-wide, isotropic deposition and subsequent anisotropic re-etching of a further auxiliary layer;

g) depositing surface-wide a refractory metallization;

h) etching back the metallization to an extent in planarizing fashion such that separate contacts for source, gate and drain remain;

i) providing the contacts with a terminal metallization; and j) removing at least one layer of the sequence of layers of the passivation layer.

10. The method according to claim 9, wherein, in step a), the barrier layer is grown of AlGaAs and the ohmic contact layer is grown of InGaAs.

11. The method according to claim 9, wherein, in step a), at least one further layer of a semiconductor material, which is selectively etchable relative to the barrier layer, is grown between the barrier layer and the ohmic contact layer.

12. The method according to claim 9, wherein, in step a), an intermediate layer of GaAs, which is a layer provided as an etch stop layer and composed of a semiconductor material selectively etchable relative to InGaAs, and a second layer of InGaAs, which is provided as an ohmic contact layer, are grown successively onto a first layer of InGaAs.

13. The method according to claim 9, wherein in step b), the passivation layer is $Si_3N_4$; wherein, in step c), the auxiliary layer is $SiO_2$; and wherein, in step d), i) the ohmic contact layer is removed down to the etch stop layer, ii) the etch stop layer is removed, iii) the intermediate layer is substantially removed with reactive ion etching in an $Ar:SiCl_4$ plasma, iv) $SF_6$ is added to the gases of the plasma in step ii, v) the reactive ion etching process is continued in an $Ar:SiCl_4:SF_6$ plasma, whereby temperature and remaining parameters of the process are set such that a further etch stop layer of aluminum fluoride is formed at an upper side of the barrier layer when the barrier layer is reached, vi) $SiCl_4$ is withdrawn from gases of the plasma, and the step e) is implemented in that the reactive ion etching process is continued in an $Ar:SF_6$ plasma.

14. A method for manufacturing a field effect transistor, comprising the steps of:

a) growing a channel layer, a barrier layer of semiconductor material and an ohmic contact layer of a semiconductor material, which has low ohmic impedance with metal, onto a substrate of semiconductor materials and growing an intermediate layer of GaAs, which is a layer provided as an etch stop layer and composed of a semiconductor material selectively etchable relative to InGaAs, and a second layer of InGaAs, which is provided as the ohmic contact layer, successively onto a first layer of InGaAs;

b) applying a passivation layer over the ohmic contact layer with an opening in a region of a gate to be manufactured;

c) anisotropically depositing an auxiliary layer with an oblique incident direction with respect to the semiconductor layer such that an upper side of semiconductor material of the ohmic contact layer is left free of material of auxiliary layer in a region of the opening in the passivation layer;

d) etching out semiconductor material down to the barrier layer using the auxiliary layer as a mask;

e) removing the auxiliary layer;

f) producing spacers at lateral sidewalls of the passivation layer by surface-wide, isotropic deposition and subsequent anisotropic re-etching of a further auxiliary layer;

g) depositing surface-wide a refractory metallization;

h) etching back the metallization to an extent in planarizing fashion such that separate contacts for source, gate and drain remain; and i) providing the contacts with a terminal metallization.

15. The method according to claim 14, wherein, in step b), the passivation layer is applied as a sequence of layers composed of a dielectric layer and of at least one metal layer; and wherein, in step i), at least one metal layer of the passivation layer is removed after application of the terminal metallization.

16. The method according to claim 15, wherein the passivation layer is manufactured as a sequence of layers composed of silicon nitride, titanium and aluminum.

17. The method according to claim 14, wherein, in step b), the passivation layer is applied as sequence of layers composed of a dielectric layer and of a polyimide layer; and wherein, in step i), the polyimide layer is removed after application of the terminal metallization.

18. The method according to claim 14, wherein, in step a), the barrier layer is grown of AlGaAs and the ohmic contact layer is grown of InGaAs.

19. The method according to claim 14, wherein in step b), the passivation layer is $Si_3N_4$; wherein, in step c), the auxiliary layer is $SiO_2$; and wherein, in step d), i) the ohmic contact layer is removed down to the etch stop layer, ii) the etch stop layer is removed, iii) the intermediate layer is substantially removed with reactive ion etching in an $Ar:SiCl_4$ plasma, iv) $SF_6$ is added to the gases of the plasma in step ii, v) the reactive ion etching process is continued in an $Ar:SiCl_4:SF_6$ plasma, whereby temperature and remaining parameters of the process are set such that a further etch stop layer of aluminum fluoride is formed at an upper side of the barrier layer when the barrier layer is reached, vi) $SiCl_4$ is withdrawn from gases of the plasma, and the step e) is implemented in that the reactive ion etching process is continued in an $Ar:SF_6$ plasma.

* * * * *